United States Patent
Carissimi et al.

(10) Patent No.: US 9,443,566 B2
(45) Date of Patent: Sep. 13, 2016

(54) IDENTIFICATION OF A CONDITION OF A SECTOR OF MEMORY CELLS IN A NON-VOLATILE MEMORY

(71) Applicant: STMicroelectronics S.R.L., Agrate Brianza (IT)

(72) Inventors: Marcella Carissimi, Treviolo (IT); Marco Pasotti, Travaco' Siccomario (IT); Fabio De Santis, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 204 days.

(21) Appl. No.: 14/061,977

(22) Filed: Oct. 24, 2013

(65) Prior Publication Data

US 2014/0112080 A1    Apr. 24, 2014

(30) Foreign Application Priority Data

Oct. 24, 2012 (IT) .............................. MI2012A1807

(51) Int. Cl.
| | |
|---|---|
| *G11C 16/28* | (2006.01) |
| *G11C 7/06* | (2006.01) |
| *G11C 7/08* | (2006.01) |
| *G11C 16/04* | (2006.01) |

(52) U.S. Cl.
CPC ............... *G11C 7/062* (2013.01); *G11C 7/06* (2013.01); *G11C 7/08* (2013.01); *G11C 16/0441* (2013.01); *G11C 16/28* (2013.01)

(58) Field of Classification Search
CPC ......... G11C 16/28; G11C 7/24; G11C 7/062; G11C 7/065; G11C 2207/063; G11C 2211/4013; G11C 2216/14; G11C 2216/16; G11C 2216/18
See application file for complete search history.

(56) References Cited

U.S. PATENT DOCUMENTS

| | | | | |
|---|---|---|---|---|
| 5,097,449 A | * | 3/1992 | Cuevas | G11C 11/005 365/154 |
| 6,655,758 B2 | | 12/2003 | Pasotti et al. | |
| 6,788,576 B2 | * | 9/2004 | Roizin | G11C 16/0441 257/E21.422 |
| 7,605,700 B2 | * | 10/2009 | Drago | G06K 19/0723 340/10.1 |
| 7,719,896 B1 | | 5/2010 | Pesavento et al. | |

OTHER PUBLICATIONS

Search Report for Italian patent application No. MI20121807, The Hague, Holland, Mar. 1, 2013, 2 pages.

* cited by examiner

*Primary Examiner* — Andrew Q Tran
(74) *Attorney, Agent, or Firm* — Gardere Wynne Sewell LLP (57) ABSTRACT

An embodiment solution for operating a non-volatile memory of a complementary type is proposed. The non-volatile memory includes a plurality of sectors of memory cells, each memory cell being adapted to take a programmed state or an erased state. Moreover, the memory cells are arranged in locations each formed by a direct memory cell and a complementary memory cell. Each sector of the non-volatile memory is in a non-written condition when the corresponding memory cells are in equal states and is in a written condition wherein each location thereof stores a first logic value or a second logic value when the memory cells of the location are in a first combination of different states or in a second combination of different states, respectively. In an embodiment, a corresponding method includes the following steps: selecting at least one of the sectors, determining an indication of the number of memory cells in the programmed state and an indication of the number of memory cells in the erased state of the selected sector, and identifying the condition of the selected sector according to a comparison between the indication of the number of memory cells in the programmed state and the indication of the number of memory cells in the erased state.

11 Claims, 4 Drawing Sheets

IDENTIFICATION OF A CONDITION OF A SECTOR OF MEMORY CELLS IN A NON-VOLATILE MEMORY

PRIORITY CLAIM

The instant application claims priority to Italian Patent Application No. MI2012A001807, filed 24 Oct. 2012, which application is incorporated herein by reference in its entirety.

SUMMARY

One or more embodiments relate to the field of electronics. In greater detail, an embodiment refers to non-volatile memories of a complementary type.

Non-Volatile Memories (NVM) have a wide diffusion and have become very important for storing large amounts of data in many consumer-electronic products (such as computers, mobile phones, digital cameras, etc.) and in apparatuses of various types (e.g., electric household appliances, precision tools, and control units of vehicles).

In general, a NVM includes a plurality of memory cells each adapted to take a selected one between two states characterized by opposite characteristics (i.e., erased or programmed). In particular, in a NVM of the complementary type, the memory cells are organized in pairs, each including a direct memory cell and a complementary memory cell that define a location adapted to store an information bit (logic value 0 or 1). Each bit is stored by bringing the direct memory cell into a state corresponding to the bit (e.g., programmed for the logic value 0 and erased for the logic value 1), while the complementary memory cell is brought into a logic state corresponding to the complement of the bit.

Typically, the memory cells are organized in rows and columns to form a matrix structure. In addition, the matrix structure is subdivided into a plurality of sub-groups or sectors. The reading and writing operations on the cells of the memory are performed using ancillary components including row, column, and sector decoders, and logic circuits, which allow accessing the memory cells to perform the required operations. In particular, for limiting the complexity of a control system of the NVM often it happens that the operations are performed by acting simultaneously on a plurality of memory cells at the same time, for example, of a whole sector.

In the complementary NVM, a sector is in a written condition if all the locations store a bit (i.e., its memory cells are in different states), otherwise the sector is in a non-written condition (i.e., its memory cells are in the same state).

A reading operation of a sector occurs in a differential mode; for example, one or more sense amplifiers perform a comparison of electrical quantities (e.g., currents) provided by the two memory cells of each location for determining the stored bit according to their difference.

Conversely, a typical writing operation of a sector involves three distinct phases. A (first) soft-programming phase brings all the memory cells of the sector into the programmed state. A (second) erasing phase brings all the memory cells of the sector into the erased state. These two phases cause a substantially equal average number of operations on each memory cell, so as to ensure a substantially uniform ageing for all the memory cells. A (third) programming phase brings the memory cells of each location of the sector into the programmed or erased state corresponding to the bits to be written therein.

Each of the three phases just described has a respective time duration typically in the order of milliseconds (ms). Therefore, the total duration of the writing operation of the sector has a non-negligible duration, which may be problematic in applications in which a fast writing is required. Indeed, an excessive duration of the writing operation may lead to an inability to store the bits into the sector, or it may cause a partial writing thereof, events that may lead to malfunctions or efficiency degradations of a system in which the NVM is included.

For example, this problem has a particularly high impact in the case of writing of emergency data (e.g., instructions being currently executed in the system, registers of the performed processes and/or diagnostic information) as a result of a sudden interruption of electric energy (e.g., because of a shortcoming in the power grid or a battery depletion) or a critical malfunction, such as causing a system crash.

In general terms, one or more embodiments are based on the idea of identifying the condition of a specific sector of the memory cell.

In particular, one or more aspects according to specific embodiments are described, with any advantageous features provided with reference to a specific aspect according to an embodiment that apply mutatis mutandis at any other aspect.

More specifically, an aspect according to an embodiment is a method for operating a non-volatile memory, wherein a condition of a sector of memory cells is determined according to a comparison between an indication of the number of memory cells in the programmed state and an indication of the number of memory cells in the erased state of the sector.

Another aspect according to an embodiment is a program product for implementing such method.

Another aspect according to an embodiment is a controller for a non-volatile memory adapted to implement such method.

Another aspect according to an embodiment is a non-volatile memory comprising such controller.

Another aspect according to an embodiment is a system including one or more of such non-volatile memories.

BRIEF DESCRIPTION OF THE DRAWINGS

One or more embodiments, as well as additional features and advantages, will be better understood with reference to the following detailed description, given purely by way of a non-restrictive indication and without limitation, to be read in conjunction with the attached figures (wherein corresponding elements are denoted with equal or similar references and their explanation is not repeated for the sake of brevity). In particular.

DETAILED DESCRIPTION

Figure 1:
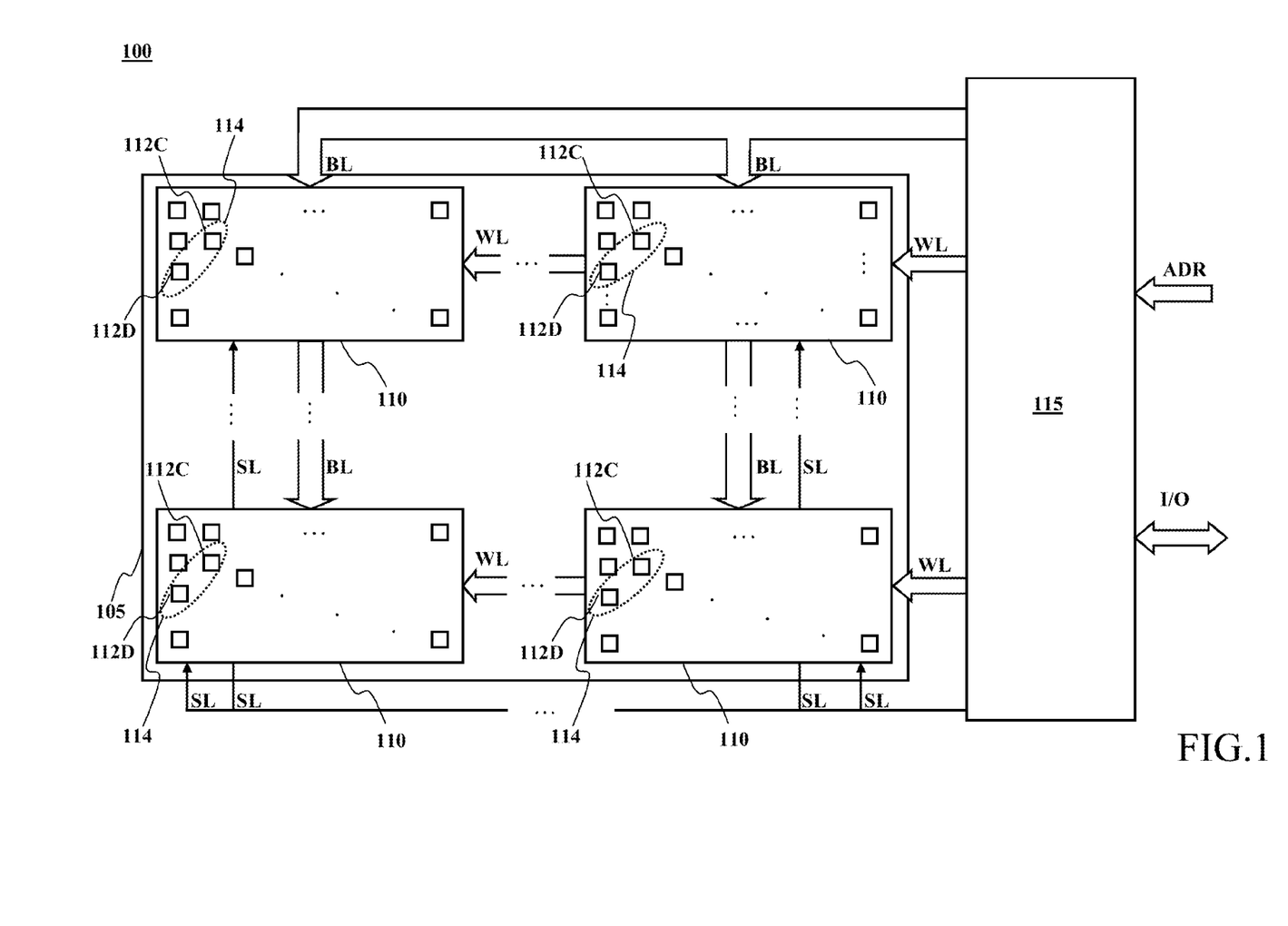
FIG. 1 illustrates a principle block diagram of a non-volatile memory device according to an embodiment.

With reference in particular to FIG. 1, there is illustrated a principle block diagram of a non-volatile memory device, or NVM, 100 according to an embodiment.

In particular, purely by way of example, the illustrated NVM 100 belongs to an EEPROM ("Electrically Erasable Programmable Read Only Memory") type of memory.

The NVM 100 includes a memory matrix 105, which is formed by a plurality of sectors 110 (only four shown in the figure) of electrically erasable and programmable memory cells 112D,112C organized in rows and columns (e.g., 128-512 rows and 512-1024 columns). For example, each memory cell 112D, 112C may be formed in a cheap and simple manner with a transistor (not shown in the figure) having a single polysilicon layer (single-poly transistor).

Generally, each memory cell 112D,112C may be set into an erased state corresponding to a first logic value (e.g., 1) or into a programmed state corresponding to a second logic value (e.g., 0); for example, the memory cell 112D,112C is programmed or erased when its transistor has a high threshold voltage or a low threshold voltage, respectively.

In each sector 110, a word is stored formed by a sequence of bits, each of which is stored in a location 114 formed by a pair of a direct memory cell 112D and a complementary memory cell 112C; in detail, each bit is stored by bringing the direct cell 112D into a state corresponding to the logic value represented by such bit, while the complementary cell 112C is brought into a logic state being complementary to the logic value represented by the bit. In the NVM, a sector 110 is in a written condition if each of its locations 114 stores a bit (i.e., the respective direct 112D and complementary 112C memory cells are in different states one with respect to the other), otherwise the sector 110 is in a non-written condition (i.e., the respective direct 112D and complementary 112C memory cells are in the same state).

In order to permit an access to the memory cells 112D, 112C, the matrix 105 includes a plurality of bit lines BL each for accessing a column of memory cells 112D, 112C in a column of sectors 110 of the matrix 105, and a plurality of word lines WL, each for accessing a row of memory cells 112D, 112C in a row of sectors 110 of the matrix 105. The matrix 105 also includes a plurality of sector lines SL, each for selecting a corresponding sector 110.

The sectors 110 and the memory cells 112D, 112C are selected via a corresponding address ADR supplied to the NVM 100 by an electronic element external thereto (e.g., by a microcontroller included in an electronic system, not shown, in which the NVM 100 is used). In greater detail, the NVM 100 includes a control system 115 (for example, including logic circuits, row, column, and sector decoders), which, starting from the received address ADR, selects the sector 110 and the locations 114 (i.e., the memory cells 112D, 112C) within it by biasing the corresponding word line(s) WL, bit line(s) BL, and sector line(s) SL to predetermined voltage levels 110.

Furthermore, the control system 115 of the NVM 100 includes circuits (not shown in FIG. 1) used to perform the desired operations on the selected memory cells (e.g., biasing circuits, reading circuits, comparators, and so on). The control system 115 is adapted to be input bits to be written into the NVM 100 and to output bits read therefrom.

Figure 2:
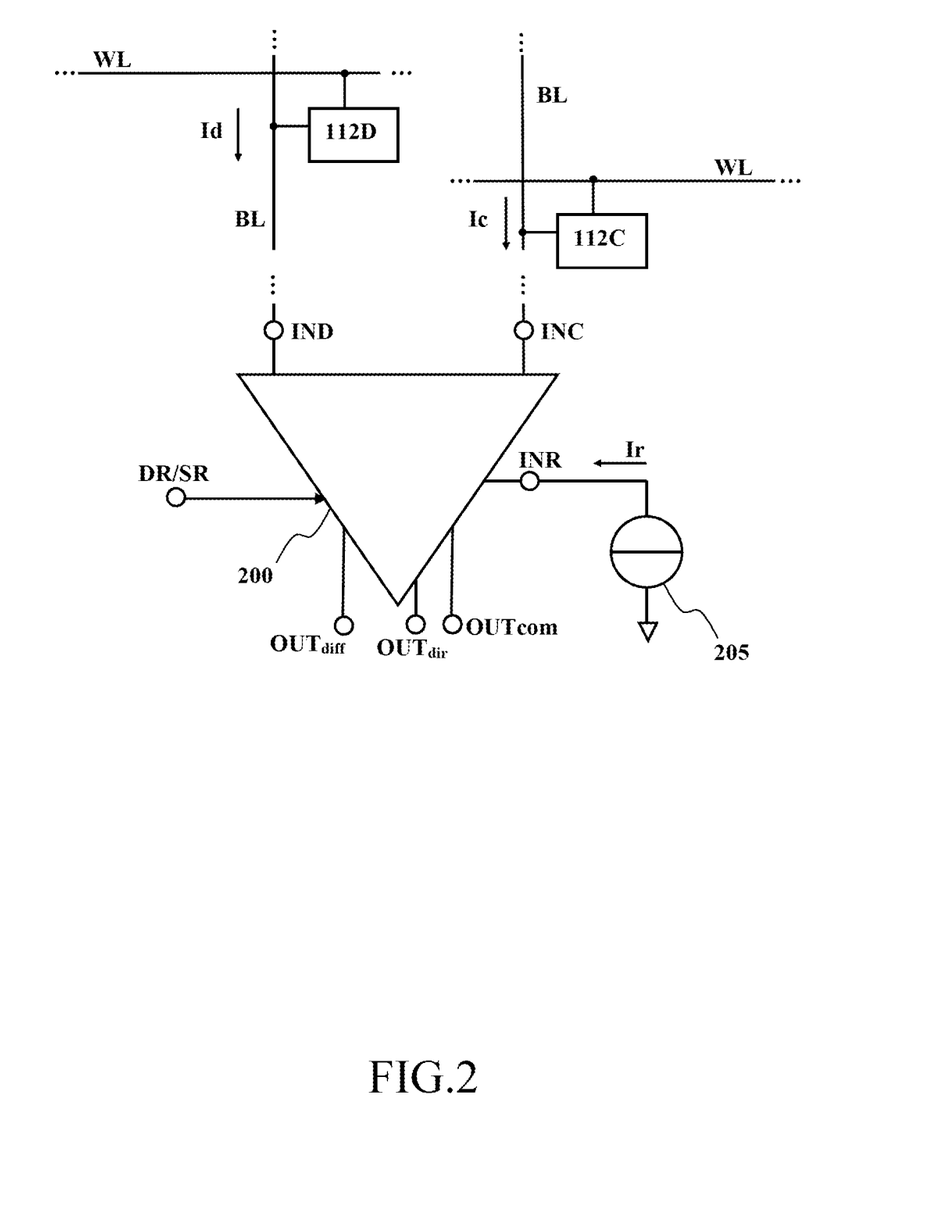
FIG. 2 illustrates a principle block diagram of a current comparator of such non-volatile memory device according to an embodiment.

Turning now to FIG. 2, there is illustrated a principle block diagram of a current comparator, or sense amplifier 200, of such NVM according to an embodiment.

The sense amplifier 200 is used to identify the value stored in each location 114. In detail, the sense amplifier 200 includes a direct input IND and a complementary input INC each of which may be selectively coupled to a bit line BL. Furthermore, the sense amplifier 200 includes a (differential) output OUTdiff coupled to the control system previously described (not shown in the figure).

In an embodiment, the sense amplifier 200 further includes a special direct output OUTdir and a special complementary output OUTcom coupled to the same control system. In addition, the sense amplifier 200 includes a reference input INR, which is coupled to a reference current generator 205 for receiving a reference current Ir. The sense amplifier 200 also includes a reading selection input DR/SR for enabling a (standard) differential reading mode or a special reading mode (according to an embodiment).

Having described the structure of the NVM 100 and of the sense amplifier 200, with joint reference to FIGS. 1 and 2, there will now be described some operations performed by the NVM 100.

A typical reading operation of the NVM 100 occurs in differential mode. In detail, starting from the address ADR, the control system 115 selects one or more sectors 110 through one or more corresponding sector lines SL and enables each sense amplifier 200 in differential mode (via an appropriate signal supplied to the reading selection input DR/SR). Subsequently, the control system 115 identifies the bits stored in each location 114 of each selected sector 110 (in series or in parallel according to an architecture of the control system 115).

In particular, a bit line BL associated with the direct memory cell 112D is coupled to the direct input IND of the sense amplifier 200, while another bit line BL associated with the complementary memory cell 112C is coupled to the complementary input INC of the sense amplifier 200. The memory cells 112D and 112C are biased for reading through the corresponding word line WL. At this point, the sense amplifier 200 receives an electric current Id provided by the memory cell 112D at the direct input IND, and an electric current Ic provided by the complementary memory cell 112C at the complementary input INC. The sense amplifier 200 then performs a differential comparison between the intensity of the currents Id and Ic. The sense amplifier 200 determines the logic value of the bit stored in the location 114 on the basis of such comparison of the intensities of the currents Id and Ic and provides it to the output OUTdiff (to be transferred outside the NVM 100 or to be used in other processes therein).

In an embodiment, the NVM 100 is also able to perform a special reading. In detail, starting from the address ADR, the control system 115 selects one or more sectors 110 through one or more corresponding sector lines SL and enables the sense amplifier 200 in the special reading mode (by a further suitable signal provided to the reading selection input DR/SR). Subsequently, for each sector 110, the control system 115 identifies the state in which each memory cell 112D, 112C is (again, in series or in parallel according to an architecture of the control system 115). In particular, the bit line BL associated with the memory cell 112D, 112C is coupled to the corresponding (direct or complementary) input IND, INC of the sense amplifier 200. The memory cell 112D, 112C is biased for reading through the corresponding word line WL. At this point, the sense amplifier 200 receives the electric current Id, Ic supplied by the memory cell 112D, 112C at the input IND, INC. In this case, however, the sense amplifier 200 performs a comparison between the intensity of the electric current Id, Ic provided by the memory cell 112D, 112C and an intensity of the reference electric current Ir received at the reference input INR (from the reference current generator), and it determines a state taken by the memory cell 112D, 112C accordingly. For example, the sense amplifier 200 may identify the memory cell 112D, 112C being in the programmed state when the electric current Id, Ic supplied therefrom has an intensity higher than the intensity of the reference current Ir; vice-versa, the sense amplifier 200 may identify the memory cell 112D, 112C being in the erased state when the electric current Id, Ic supplied therefrom has an intensity equal to or lower than the intensity of the reference current Ir. Finally, the sense amplifier 200 provides the logic value corresponding to the state of the memory cell 112D, 112C to the corresponding output OUTdir, OUTcom (to be transferred outside the NVM 100 or to be used in other processes therein). Advantageously, although not limitatively, the sense amplifier 200 may be adapted to perform the special reading operation in parallel on the direct memory cell 112D and on the complementary memory cell 112C of the location 114 (reducing a time required for performing the special reading operation).

Thanks to the special reading operation, according to an embodiment, it is possible to determine which sectors 110 are in the non-written condition (i.e., with all the memory cells 112D, 112C in the same programmed or erased state), being impractical or impossible through the differential reading operation. In fact, during the differential reading operation of a sector 110 in the non-written condition, the electric currents Id and Ic supplied from the memory cells 112D, 112C of each location 114 thereof have a substantially identical intensity; therefore, the sense amplifier 200 typically is not able to determine a valid result from a comparison between such electric currents Id and Ic.

Furthermore, the special reading operation allows identifying whether the sector 110 in the non-written condition is in a soft-programmed non-written condition (substantially with all the memory cells in the programmed state) or in an erased non-written condition (substantially with all the memory cells in the erased state).

The special reading operation also allows identifying the sector 110 in the written condition (substantially with a half of memory cells 112D, 112C of the sector 110 in the programmed state, while the other half is in the erased state).

Unfortunately, the NVM 100 is subject to non-idealities (as electromagnetic interference, leakage currents, high temperature variations etc.), which may undesirably modify the state taken by one or more memory cells 112D, 112C. The frequency of these unwanted state changes increases correspondingly to the size reduction (scaling) of the NVM 100, and it is not negligible in a low-cost version of the NVM 100. Therefore, in the soft-programmed non-written condition some memory cells 112D, 112C of the sector 110 may be in the erased state, while in the erased non-written condition some memory cells 112D, 112C of the sector 110 may be in the programmed state. Similarly, the sector 110 in the written condition may comprise some memory cells 112D, 112C in a state other than the one set by the previous writing operation.

In an embodiment, an exceeding of a statistical threshold value by the number of memory cells 112D, 112C in the programmed or erased state in the sector 110 is detected for excluding that the latter is in an erased or soft-programmed non-written condition, respectively.

In particular, by considering the sector 110 in an erased non-written condition (although the same considerations may be applied to the sector 110 in a soft-programmed non-written condition, mutatis mutandis) there is a probability $P_{PROG}$ to have a memory cell 112D, 112C in a modified state (i.e., in the programmed state instead of the erased state) depending on the technology used to manufacture the NVM 100. Therefore, a probability $P_\epsilon$ of detecting k memory cells 112D, 112C in an altered (programmed) state in the sector 110 in the erased non-written condition turns out to be:

$$P_\epsilon \sim 2N!/((2N-k-1)!*k!)*P_{prog}^k, \quad (1)$$

in which it is assumed that the sector 110 is dimensioned to store N bits, i.e., the sector 110 includes 2N memory cells 112D, 112C.

It is possible to set a maximum acceptable value for the probability $P_\epsilon$ (e.g., $P_\epsilon \ll 1$ ppm in a sector 110 with N=1 Kb) and then to determine a maximum acceptable number k' of memory cells 112D, 112C in the programmed state, which is used as statistical threshold value. During the special reading operation, the sector 110 is identified in the erased non-written condition if a number y of memory cells 112D, 112C detected in the programmed state is lower than or equal to the maximum acceptable number k' (i.e., y<=k'). On the contrary, it is excluded that the sector is in the erased non-written condition if the number y of memory cells 112D, 112C detected in the programmed state is greater than the maximum acceptable number k' (i.e., y>k').

In addition, in the NVM 100 according to an embodiment, it is also possible to determine a further maximum acceptable number k"—used as a further statistical threshold—of memory cells 112D, 112C in the programmed state (e.g., equal to 50% plus the value calculated again by the equation (1)) detectable in a sector in the written condition. Therefore, during the special reading operation, each sector 110 is identified in the written condition if the number y of memory cells 112D, 112C detected in the programmed state is between the maximum acceptable number k' and the further maximum acceptable number k". On the contrary, when the special reading operation determines that the number y of memory cells 112D, 112C detected in the programmed state is greater than the further maximum acceptable number k", the sector 110 is identified in the soft-programmed non-written condition.

As an example, where a sector stores an n-bit word, in which each bit is composed of two cells, one direct and one complementary, if more than (n/2)+1 direct cells are programmed, then the sector is recognized as being programmed and data may be provided to the sector from an external source; otherwise, the sector is recognized as being erased.

A similar example uses complementary cells. That is, if more than (n/2)+1 complementary cells are programmed, then the sector is recognized as being programmed and data may be provided to the sector from an external source. Otherwise, the sector is recognized as being erased.

In the NVM 100 according to an embodiment, it is thus possible to determine the condition in which each sector 110 is with a previously selected probability error. Moreover, in this way it is possible to exclude that the sector 110 is in the erased non-written condition or in the written condition even with a partial reading operation of the sector 110.

In addition or in alternative, the written condition of the sector 110 may be identified by detecting the presence of a predetermined sequence of logic values stored in predetermined locations thereof. Indeed, each word generally includes an initial sequence, or header, which indicates its type (e.g., a first header indicates instructions, a second header indicates status information, and a third header indicates results of operations). The control system 115 may be configured to recognize such header during the special reading operation based on the state of the memory cells 112D and 112C corresponding to the locations 114 that store the header bits. In this way, it is possible to determine that the sector 110 is in the written condition by comparing the bits stored in the corresponding locations 114 with one or more known strings of bits, based on the state in which only the memory cells 112D and 112C corresponding to the header are (therefore with a particularly reduced time).

The embodiment described above may be exploited for a variety of purposes.

Figure 3:
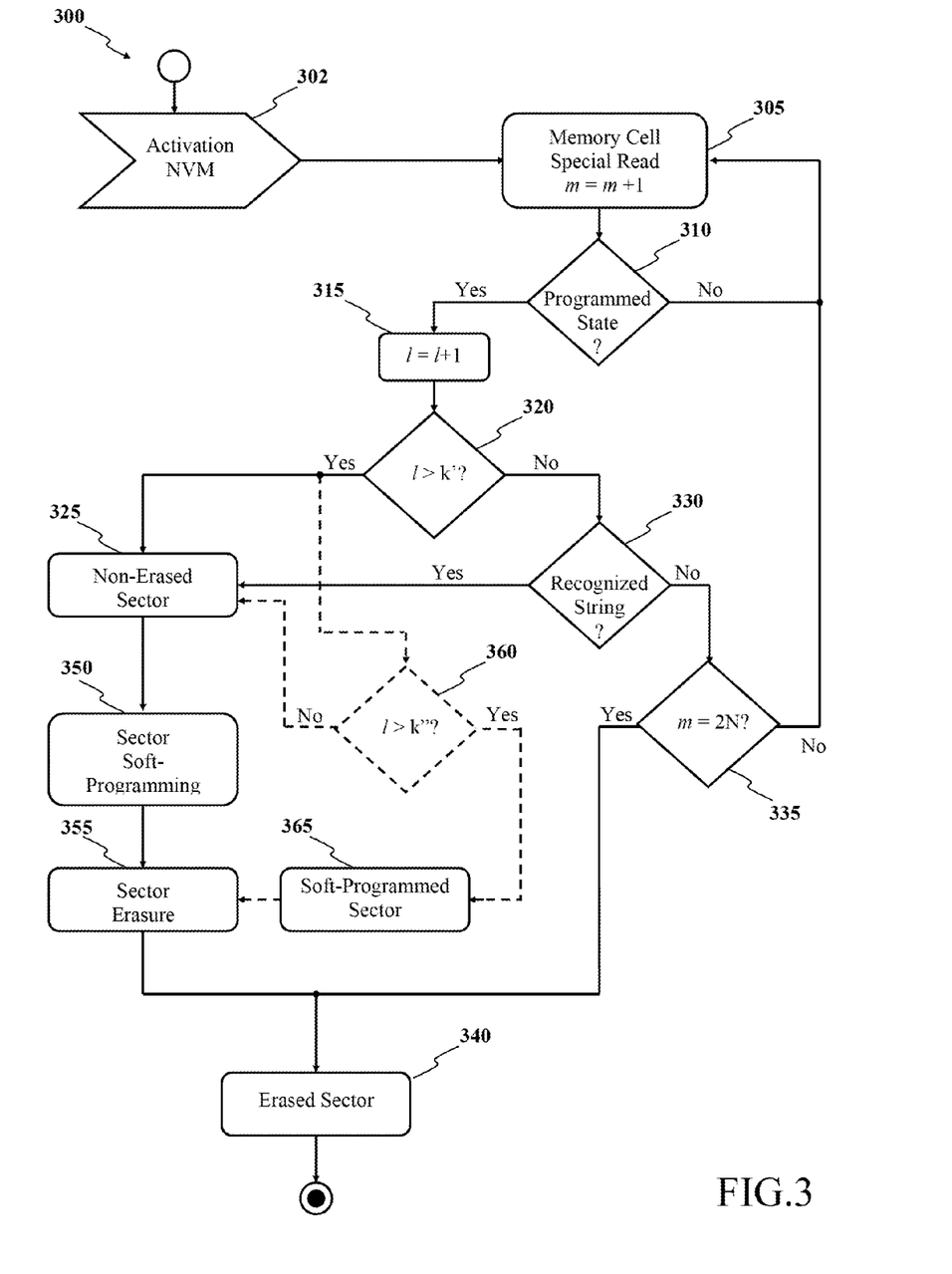
FIG. 3 illustrates an exemplary flow diagram of a start-up phase of the non-volatile memory device according to an embodiment.

For example, with reference now to FIG. 3, there is illustrated a flow diagram exemplificative of a start-up phase 300 of the NVM according to an embodiment.

The start-up phase begins at block 302 by providing (e.g., via the microcontroller mentioned earlier) a start-up command to the NVM. The start-up command may include the address ADR of a predetermined sector (or more), or such address ADR may be pre-set in a fixed manner in the control system of the NVM. The predetermined sector is dedicated to store emergency data (e.g., instructions currently being executed in the electronic system, registers of performed processes, or diagnostic information) in the case of particular events (such as an interruption of the electrical energy that supplies the NVM, a malfunction of the electronic system, etc.). Consequently, the predetermined sector is selected through the corresponding sector line by the control system of the NVM.

Initially, at block 305 the special reading operation is performed on the predetermined sector for determining the condition thereof, in which each memory cell is selected (through the respective bit line and word line) and its state is identified as previously described; for each memory cell a value m stored in a counter—e.g., located in the control system—is increased. The activity flow branches at block 310 according to the state of the memory cell. If the memory cell is identified in the programmed state, at block 315 a value/of a further counter—e.g., also located in the control system—is incremented; continuing to block 320, it is checked whether the counter value/exceeds the maximum acceptable number k' of memory cells in the programmed state. In the affirmative case, the sector is identified in a condition different from the erased non-written condition at block 325 (described in the following).

Otherwise, the start-up phase passes from block 320 to block 330, in which it is verified whether the header is identified of the word of bits possibly stored in the predetermined sector. For this purpose, a comparison is made between the value of the memory cells of the locations corresponding to a possible header of the word and a set of predetermined bit sequences corresponding to known headers. In the affirmative case, the sector is identified in the written condition (and therefore again different from the erased non-written condition), so that the method in this case as well passes to block 325.

Otherwise, the method passes from block 330 to block 335 in which it is checked whether the counter value m corresponds to the number of memory cells in the sector (i.e., m=2N). In the affirmative case, the sector is identified in the erased non-written condition at block 340, and the start-up phase ends. Otherwise, the method returns to block 305 to perform the special reading of another memory cell of the predetermined sector.

Returning now to block 325, the method descends to block 350, in which it is performed a soft-programming of the predetermined sector. In particular, the soft-programming sets the programmed state into each memory cell of the predetermined sector—in particular, the memory cells are selected through the corresponding word lines and bit lines which are biased in such a way to set the programmed state therein. Moving on to the block 355, an erasure of the predetermined sector is performed, by setting the erased state into each memory cell thereof—particularly, the memory cells are selected through the corresponding word lines and bit lines, which are biased in such a way to erase them. The start-up phase then ends at block 340.

Thanks to the start-up phase, it is possible to set the predetermined sector into the erased non-written condition at the start-up of the NVM, thereby allowing a fast and reliable storage of emergency data in the predetermined sector, even in the event of the occurrence of the particular events mentioned above. Indeed, the predetermined sector in the erased non-written condition may be subject to a fast writing operation, which allows storing a word in extremely short times. In detail, the fast writing operation directly sets the corresponding target logical value into each location—of the predetermined sector (without the need to perform any soft-programming and erasing thereof).

In an alternative embodiment (illustrated in dashed line in the figure), the special reading operation after the exceeding of the maximum acceptable number k' of memory cells proceeds from the block 320 to block 360 for determining if the counter value/exceeds the further acceptable maximum number k". In the negative case, the predetermined sector is identified in the written condition (and therefore again different from the erased non-written condition), so that the method in this case as well passes to the block 325. On the contrary, the predetermined sector is identified in the soft-programmed non-written condition at block 365. The method then proceeds directly from block 365 to block 355 (to erase the predetermined sector without any soft-programming).

Furthermore, the same method described above may also be applied after receiving a sector reset command (e.g., again provided by the microcontroller) during the operation of the NVM. The reset command is associated with the address ADR of one or more sectors storing a word to be discarded (e.g., in the case of a temporary instruction already used). Thanks to the reset command, it is possible to prearrange the sectors into the erased non-written condition, thereby obtaining the same advantages described above also during the operation of the NVM.

Figure 4:
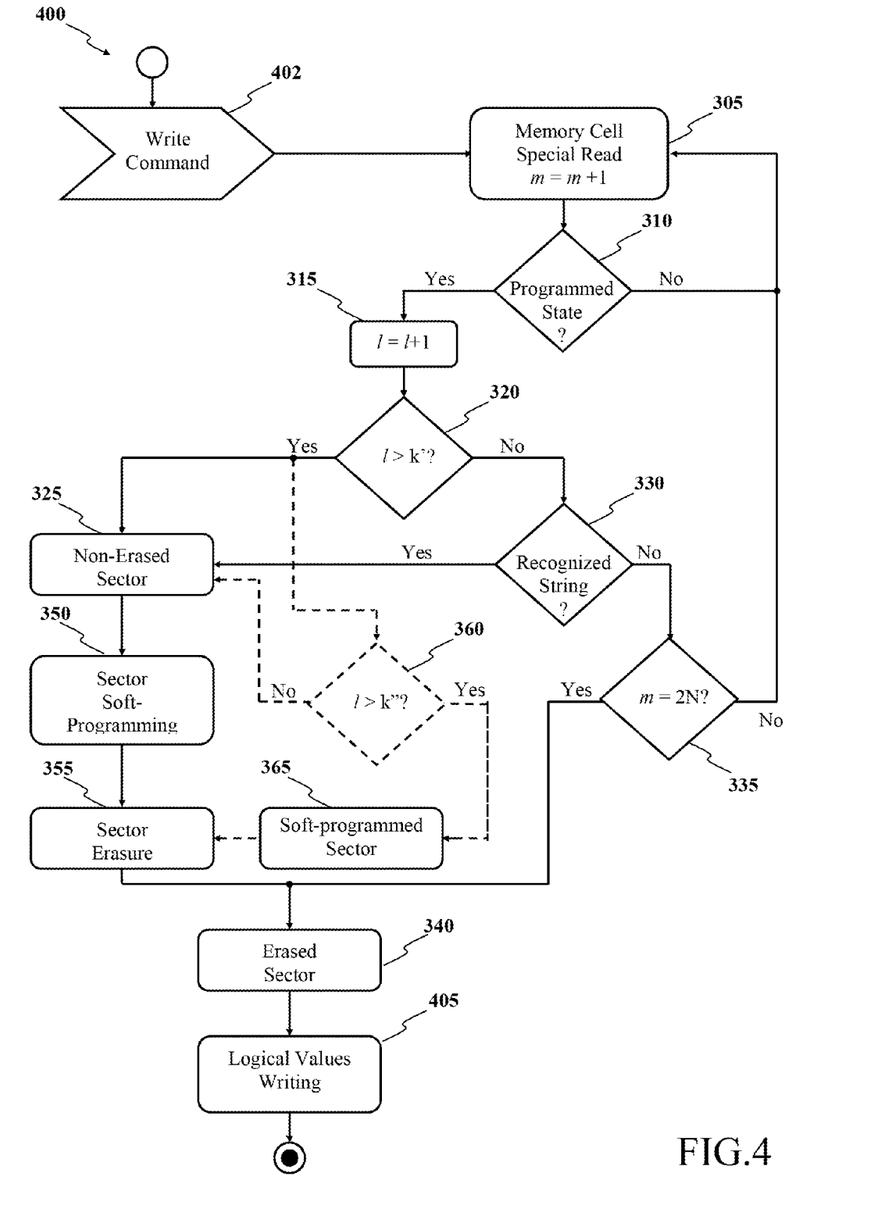
FIG. 4 illustrates an exemplary flow diagram of a writing operation into the non-volatile memory device according to an embodiment.

Turning now to FIG. 4, there is illustrated a flow diagram exemplificative of a writing operation 400 according to an alternative embodiment.

The writing operation is started at block 402 by providing (e.g., via the microcontroller mentioned above) a writing command to the NVM. The writing command is generally associated with the address ADR of the sector to be written. Consequently, such sector is selected through the corresponding sector line by the control system of the NVM. Subsequently, the same steps previously described in relation to the start-up phase of the NVM are performed, up to having the sector in the erased non-written condition (blocks 305 to 355). The method then passes from block 340 to block 405, where the corresponding target logic value is stored into each location of the sector.

In this way it is possible to perform the soft-programming or erasing operation on the sector to be written only when it is actually needed, thus improving the efficiency of the operation of the NVM.

In a further embodiment, if the sector is identified in a different condition from the erased non-written condition (at blocks 320 or 330), then the sector may be discarded (in order not to lose the stored word) and another not-yet analyzed sector may be selected to be subject to the writing operation.

Naturally, in order to satisfy local and specific requirements, one may apply to the embodiments described above many logical or physical modifications and alterations. More specifically, although embodiments have been described with a certain degree of particularity, it should be understood that various omissions, substitutions, and changes in the form and details as well as other embodiments are possible. Particularly, different embodiments may even be practiced without the specific details (such as the numerical examples) set forth in the preceding description to provide a more thorough understanding thereof; conversely, well-known features may have been omitted or simplified in order not to obscure the description with unnecessary particulars. Moreover, it is expressly intended that specific elements or method steps described in connection with any embodiment may be incorporated in any other embodiment as a matter of general design choice. In any case, the terms "comprising," "including," "having." and "containing" (and any of their forms) are to be understood with an open and non-exhaustive meaning (i.e., not limited to the recited elements), the terms "based on," "dependent on," "according to," "function of" (and any of their forms) are to be understood as a non-exclusive relationship (i.e., with possible further variables involved) and the term "a" is to be understood as one or more elements (unless expressly stated otherwise).

For example, an embodiment proposes a method for operating a non-volatile memory of a complementary type. The non-volatile memory includes a plurality of sectors of memory cells, each one adapted to take a programmed state or an erased state. Moreover, the memory cells are arranged in locations each formed by a direct memory cell and a complementary memory cell. Each sector is in a non-written condition when the corresponding memory cells are in equal states and is in a written condition wherein each location thereof stores a first logic value or a second logic value when the memory cells of the location are in a first combination of different states or in a second combination of different states, respectively. In an embodiment, a corresponding method includes the following steps: selecting at least one of the sectors, determining an indication of the number of memory cells in the programmed state and an indication of the number of memory cells in the erased state of the selected sector, and identifying the condition of the selected sector according to a comparison between the indication of the number of memory cells in the programmed state and the indication of the number of memory cells in the erased state.

However, the non-volatile memory may be of any type and size, and the programmed/erased states of its memory cells may be defined in another way; moreover, similar considerations apply in the case where only the indication of the number of memory cells in a selected one between the programmed state and the erased state of the selected sector is determined, and the indication of the number of memory cells in the other state is deducted from the total number of memory cells of the selected sector.

In an embodiment, each location is readable by comparing electrical quantities associated with the corresponding memory cells. The step of determining an indication of the number of memory cells in the programmed state and an indication of the number of memory cells in the erased state of the selected sector includes comparing the electrical quantities of at least part of the memory cells of the selected sector with a threshold value.

However, nothing prevents comparing the electrical quantity with a range of values (for example, corresponding to the programmed state or to the erased state).

In an embodiment, the step of identifying the condition of the selected sector includes identifying the selected sector as not in the non-written condition with the memory cells in one of the states when the number of memory cells of the selected sector in the other state exceeds a limit value.

However, such limit value may have any value; in any case, nothing prevents applying the same method I both the conditions of the sector, or even for no one (in which case the condition of the sector is identified by considering only the exact expected number of memory cells in the different states).

In an embodiment, the step of identifying the selected sector as not in the non-written condition with the memory cells in one of the states includes counting the memory cells of the selected sector in the other state, and stopping the counting when the number of memory cells of the selected sector in the other state exceeds the limit value.

However, nothing prevents continuing the counting to determine the actual condition of the sector.

In an embodiment, the method further includes the step of identifying the selected sector as in the written condition when a predetermined subset of the locations thereof stores a predetermined sequence of logic values.

However, the predetermined subset may be in any position and of any size; moreover, nothing prevents identifying the written condition when each one of all the locations of the sector stores a respective predetermined value. Similarly, it is possible to use predetermined sequences of any type and in any number (even only one). In any case, this check may be omitted in embodiments.

In an embodiment, the step of selecting at least one of the sectors includes selecting at least one of the sectors in response to a start command or a reset command of the non-volatile memory. Moreover, the method further includes, if the selected sector is identified as in the written condition, the following steps: bringing all the memory cells of the selected sector into the programmed state, and bringing all the memory cells of the selected sector from the programmed state to the erased state.

However, nothing prevents applying an embodiment only for the start-up or only for the reset, or even in none of such cases.

In an embodiment, the step of selecting at least one of the sectors includes selecting at least one of the sectors in response to a writing instruction of a word in the selected sector. The word includes a target logic value of each location of the selected sector. Moreover, the method includes, if the selected sector is identified as in the written condition, the following steps: bringing all the memory cells of the selected sector into the programmed state, and bringing all the memory cells of the selected sector from the programmed state to the erased state. The method further includes the following steps: bringing each direct memory cell of the selected sector into the state corresponding to the respective target logic value, and bringing each complementary memory cell of the selected sector into the state corresponding to the complement of the respective target logic value.

However, nothing prevents performing a standard writing in at least one of the sectors.

In an embodiment, the method includes, if the selected sector is identified as in the non-written condition with the memory cells in the programmed state, the step of bringing all the memory cells of the selected sector into the erased state.

However, nothing prevents bringing all the memory cells into the programmed state before bringing all the memory cells into the erased state in any case.

In general, similar considerations apply if the same embodiment is implemented by an equivalent method (using similar steps with the same functions of more steps or of portions thereof, removing some steps being not essential, or adding further optional steps); moreover, the steps may be performed in different order, in parallel, or overlapped (at least in part).

A different embodiment proposes a program product including code means for causing a control system of a complementary non-volatile memory to perform the steps of such methods when the program is executed on the control system.

In any case, similar considerations apply if the program is structured in a different way, or if additional modules or functions are provided. The program may take any form adapted to be used by a data-processing system or in connection with it, thereby configuring the system to perform the desired operations. Furthermore, it is possible to provide the program on any computer-usable medium (and in particular as an article of manufacture on a non-transitory medium). In any case, an embodiment lends itself to be implemented even with a hardware structure (e.g., integrated on a chip of semiconductor material), or with a combination or subcombination of software, firmware, and hardware appropriately programmed or otherwise configured.

A different embodiment proposes a controller for a non-volatile memory of complementary type comprising means adapted to implement such methods.

A different embodiment proposes a non-volatile memory of the complementary type including such a controller.

A different embodiment proposes a system (e.g., a mobile phone, a camera, and the like) including one or more of these non-volatile memories. For example, such a system may include one or more computing circuits, such as a microprocessor or microcontroller, coupled to the one or more non-volatile memories, and the computing circuit(s) and the memory(ies) may be disposed on a same or on different dies.

In general, similar considerations apply if the controller, the non-volatile memory, or the system each has a different structure or includes equivalent components (e.g., in different materials), or has other operating characteristics. In any case, any component may be separated into several elements, or two or more components may be combined into a single element; in addition, each component may be replicated to support the execution of the corresponding operations in parallel. It is also noted that (unless otherwise specified) any interaction between different components generally need not be continuous, and it may be direct or indirect through one or more intermediaries.

Moreover, one or more embodiments described above may be part of the design of an integrated circuit. The design may also be created in a hardware description language; moreover, if the designer does not manufacture the integrated device or its masks, the design may be transmitted through physical means to others. Anyway, the resulting integrated device may be distributed by its manufacturer in the form of a raw wafer, as a naked chip, or in packages.

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

The invention claimed is:
1. A method, comprising:
reading one of a non-volatile memory cell and a complementary non-volatile memory cell of a memory location independently of the other of the non-volatile memory cell and the complementary non-volatile memory cell;
reading the other of the non-volatile memory cell and the complementary non-volatile memory cell independently of the one of the non-volatile memory cell and the complementary non-volatile memory cell;
determining an erased or programmed state of a memory sector in which the memory location is disposed in response to reading the one and the other of the non-volatile memory cell and the complementary non-volatile memory cell; and
selectively erasing the non-volatile memory cells and the complementary non-volatile memory cells that form the memory sector in response to the determined erased or programmed state of the memory sector.

2. The method of claim 1 wherein:
reading the one of the non-volatile memory cell and the complementary non-volatile memory cell includes comparing a signal generated by the one of the cells with a first reference signal; and
reading the other of the non-volatile memory cell and the complementary non-volatile memory cell includes comparing a signal generated by the other of the cells with a second reference signal.

3. The method of claim 2 wherein the first and second reference signal include a same signal.

4. The method of claim 2, wherein if the determined state of the memory sector includes an erased state, then programming the non-volatile memory cells and the complementary non-volatile memory cells that form the memory sector without first erasing the non-volatile memory cells and the complementary non-volatile memory cells that form the memory sector.

5. The method of claim 2, wherein if the determined state of the memory sector includes a programmed state, then erasing the non-volatile memory cells and the complementary non-volatile memory cells that form the memory sector before programming the non-volatile memory cells and the complementary non-volatile memory cells that form the memory sector.

6. A method, comprising:
reading one of a non-volatile memory cell and a complementary non-volatile memory cell of a memory location independently of the other of the non-volatile memory cell and the complementary non-volatile memory cell;
reading the other of the non-volatile memory cell and the complementary non-volatile memory cell independently of the one of the non-volatile memory cell and the complementary non-volatile memory cell;
determining a state of a memory sector in which the memory location is disposed in response to reading the one and the other of the non-volatile memory cell and the complementary non-volatile memory cell; and
if the determined state of the memory sector includes an erased state, then programming the non-volatile memory cells and the complementary non-volatile memory cells that form the memory sector.

7. The method of claim 6 wherein:
reading the one of the non-volatile memory cell and the complementary non-volatile memory cell includes comparing a signal generated by the one of the cells with a first reference signal; and
reading the other of the non-volatile memory cell and the complementary non-volatile memory cell includes comparing a signal generated by the other of the cells with a second reference signal.

8. The method of claim 7 wherein the first and second reference signal include a same signal.

9. A method, comprising:
reading one of a non-volatile memory cell and a complementary non-volatile memory cell of a memory location independently of the other of the non-volatile memory cell and the complementary non-volatile memory cell;
reading the other of the non-volatile memory cell and the complementary non-volatile memory cell independently of the one of the non-volatile memory cell and the complementary non-volatile memory cell;
determining a state of a memory sector in which the memory location is disposed in response to reading the one and the other of the non-volatile memory cell and the complementary non-volatile memory cell; and
if the determined state of the memory sector includes a programmed state, then
erasing the non-volatile memory cells and the complementary non-volatile memory cells that form the memory sector, and
programming the non-volatile memory cells and the complementary non-volatile memory cells that form the memory sector.

10. The method of claim 9 wherein:

reading the one of the non-volatile memory cell and the complementary non-volatile memory cell includes comparing a signal generated by the one of the cells with a first reference signal; and reading the other of the non-volatile memory cell and the complementary non-volatile memory cell includes comparing a signal generated by the other of the cells with a second reference signal.

11. The method of claim 10 wherein the first and second reference signal include a same signal.

* * * * *